United States Patent [19]

Ikekawa

[11] Patent Number: 5,657,333

[45] Date of Patent: Aug. 12, 1997

[54] METHOD AND APPARATUS FOR ERROR-CONTROL CODING IN A DIGITAL DATA COMMUNICATION SYSTEM

[75] Inventor: Masao Ikekawa, Tokyo, Japan

[73] Assignee: NEC Corporation, Japan

[21] Appl. No.: 199,546

[22] Filed: Feb. 22, 1994

[30] Foreign Application Priority Data

Feb. 19, 1993 [JP] Japan .................................. 5-030036
Apr. 21, 1993 [JP] Japan .................................. 5-093455

[51] Int. Cl.$^6$ ....................... H03M 13/00; H03M 13/12
[52] U.S. Cl. .................................. 371/37.4; 371/43.6
[58] Field of Search ........................... 371/43, 44, 45, 371/37.4

[56] References Cited

U.S. PATENT DOCUMENTS

| | | | |
|---|---|---|---|
| 4,941,154 | 7/1990 | Wei | 375/39 |
| 5,195,107 | 3/1993 | Wei | 375/18 |
| 5,216,694 | 6/1993 | Wei | 375/17 |
| 5,251,236 | 10/1993 | Brehmer et al. | 375/59 |
| 5,258,987 | 11/1993 | Wei | 371/43 |
| 5,289,501 | 2/1994 | Seshadri et al. | 375/17 |

FOREIGN PATENT DOCUMENTS

| | | |
|---|---|---|
| 2238933 | 6/1991 | United Kingdom . |
| 8809967 | 12/1988 | WIPO . |

OTHER PUBLICATIONS

*IEEE Transactions on Vehicular Technology*, vol. 41, No.2, May 1992, pp. 177-189; "Simulation and Performance of the Pan-European Land Mobile Radio System".

Sundberg, C-E. et al., "Digital Cellular Systems for North America", Globecom '90, vol. 1, pp. 405.5.1-405.5.5 Dec. 1990.

*Primary Examiner*—Stephen M. Baker
*Attorney, Agent, or Firm*—Ostrolenk, Faber, Gerb & Soffen, LLP

[57] ABSTRACT

In order to ensure that a predetermined bit(s) of a bit sequence to be transmitted is correctly received by a receiver, the predetermined bit is extracted from the bit sequence. The extracted bit is encoded and then combined with a bit sequence which has not been extracted. The combined bit sequence is convolutionally encoded and then transmitted to the receiver. The bit sequence transmitted undergoes maximum-likelihood decoding using Viterbi algorithm, wherein the information of the predetermined bit encoding is used to decode the predetermined bit. Subsequently, the encoded predetermined bit portion is extracted and subjected to block decoding.

15 Claims, 10 Drawing Sheets

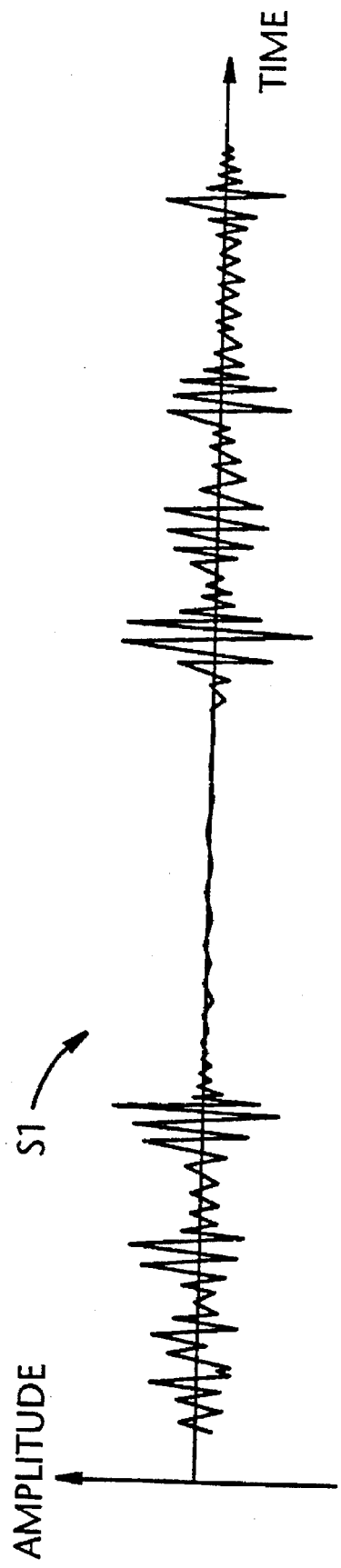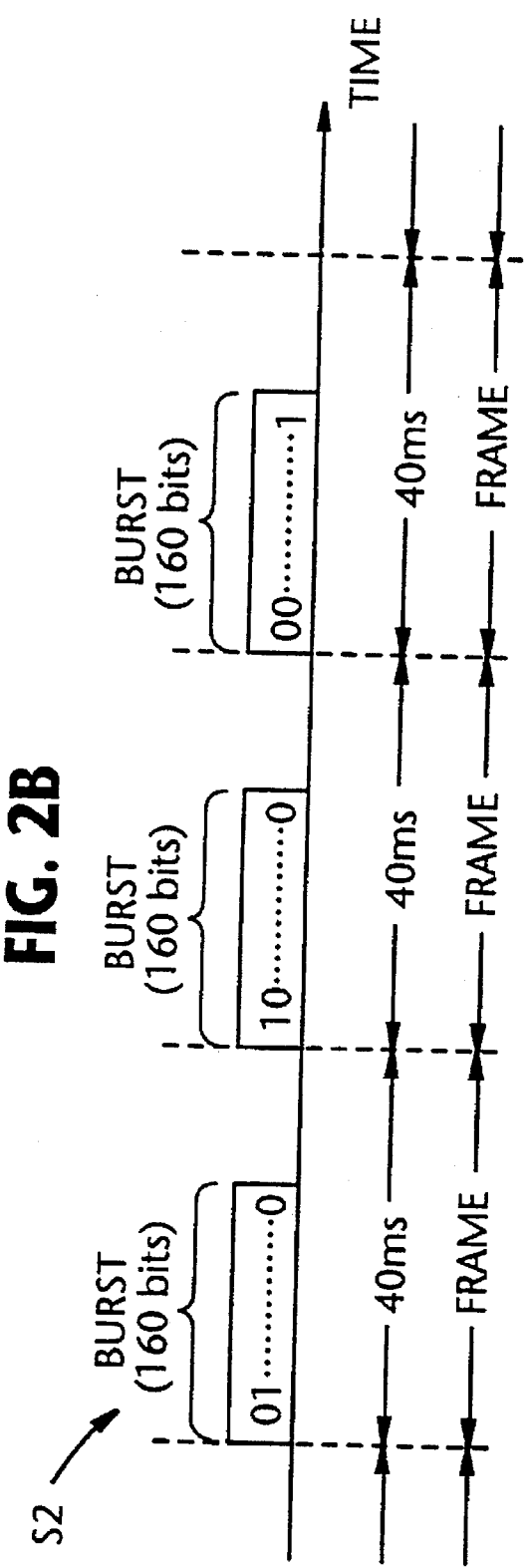
FIG. 2A
FIG. 2B

METHOD AND APPARATUS FOR ERROR-CONTROL CODING IN A DIGITAL DATA COMMUNICATION SYSTEM

BACKGROUND OF THE INVENTION

1. Field of the Invention

The present invention relates generally to a method and apparatus for implementing error-control coding in a digital data communications system, and more specifically to such a method and apparatus for correcting and/or detecting errors induced during data transmission.

2. Description of the Prior Art

In order to correct and/or detect channel bit errors induced during digital data transmission, it is well known in the art to utilize error-control coding techniques.

By way of example, these techniques are disclosed in a book entitled "Essential of Error-coding Techniques" edited by Hideki IMAI and published 1990 by Academic Press, Inc., San Diego, Calif. 92101, U.S.A., and a book entitled "Error Control Coding: Fundamentals and Applications" by Shu Lin, et al., published 1983 by Prentice-Hall, Inc., Englewood Cliffs, N.J. 07632, U.S.A.

Redundant bits are added to each binary code word to be transmitted in order to provide the code with the capability of combating channel noise. The Viterbi algorithm is capable of correcting error, almost equally over entire bits of a code word. However, it is sometimes necessary to transmit a special bit(s) of each code word with a high reliability compared with the remaining bits of code word. In order to achieve this result, according to prior art, it has been inevitably required to provide a plurality of pairs of an encoder and decoder having different error-control capability or functions. However, the above mentioned known technique suffers from the drawback that the overall system is rendered large and complex. Further, the freedom of the system design is reduced.

SUMMARY OF THE INVENTION

An object of the present invention is to provide a method for error-control coding such that one or more important bits are selected from a bit sequence and then subjected to block encoding for correctly transmitting same.

Another object of the present invention is to provide an apparatus for error-control coding such that one or more important bits are selected from a bit sequence and then subjected to block encoding for correctly transmitting same.

In brief, the above objects are achieved by a technique wherein, in order to ensure that one or more predetermined bit(s) of a bit sequence to be transmitted are correctly received by a receiver, the predetermined bit is extracted from the bit sequence. The extracted bit is encoded and then combined with a bit sequence which has not been extracted. The combined bit sequence is convolutionally encoded and then transmitted to the receiver. The bit sequence transmitted undergoes maximum-likelihood decoding using the Viterbi algorithm, wherein the information of the predetermined bit encoding is used to decode the predetermined bit. Subsequently, the encoded predetermined bit portion is extracted and subjected to block decoding.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 2A is a sketch schematically showing waveforms of an analog signal to be encoded;

FIG. 2B is a diagram schematically showing burst digital signals to be transmitted;

DETAILED DESCRIPTION OF THE PREFERRED EMBODIMENTS

A first embodiment of the present invention will be discussed with reference to FIGS. 1–7.

Figure 1:
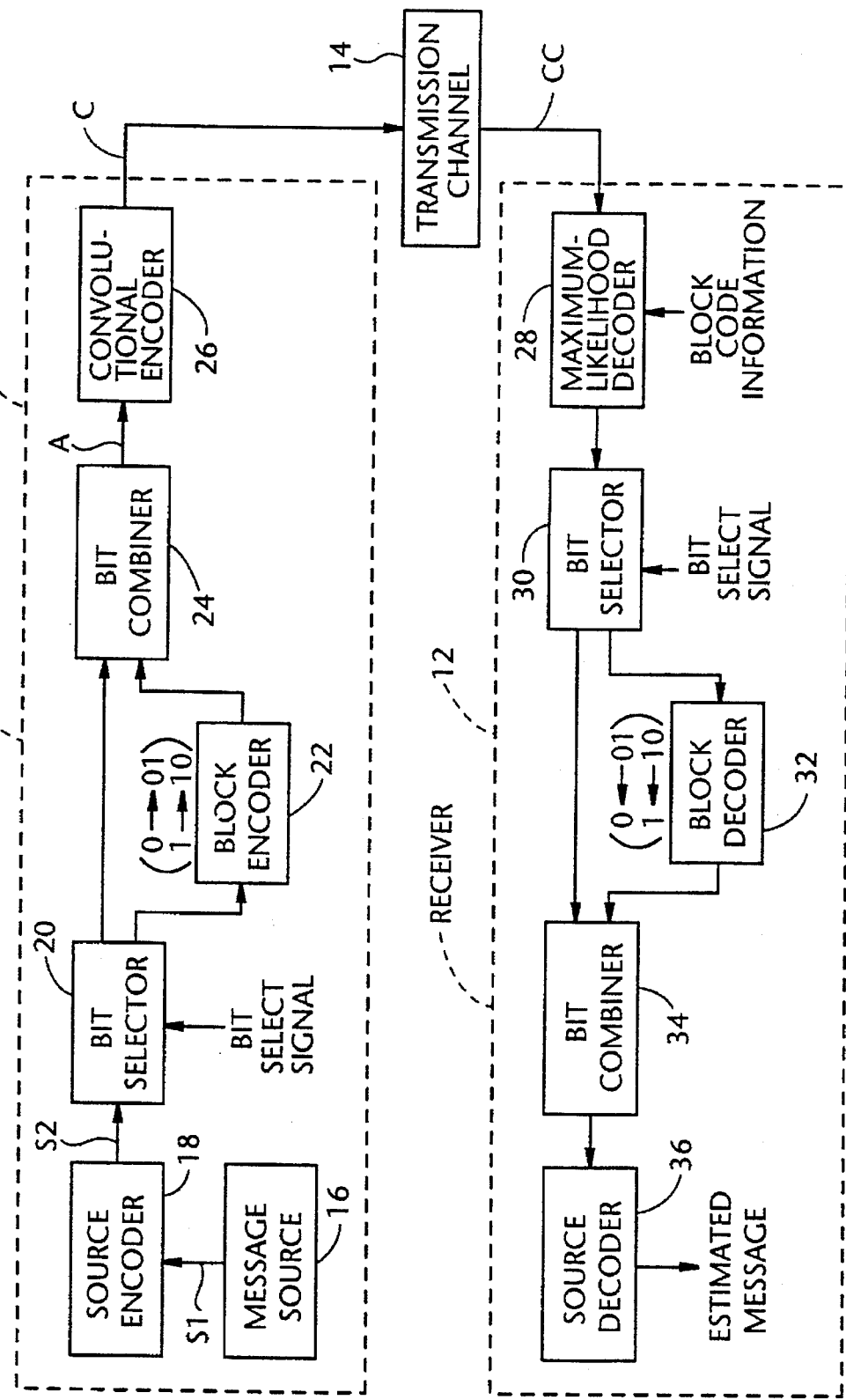
FIG. 1 is a block diagram schematically showing a first embodiment of the present invention.

FIG. 1 is a block diagram showing an arrangement of the first embodiment.

The arrangement of FIG. 1 generally includes a transmitter 10 which is interconnected to a receiver 12 via a transmission channel 14.

The transmitter 10 includes a message source 16, a source encoder 18, a bit selector 20, a block encoder 22, a bit combiner (or bit merger) 24, and a convolutional encoder 26, all of which are coupled as shown. On the other hand, the receiver 12 is comprised of a maximum-likelihood decoder 28 which operates under the Viterbi algorithm, a bit selector 30, a block decoder 32, a bit combiner 34, and a source decoder 36, all of which are coupled as illustrated.

For the sake of a better understanding of the first embodiment, it is assumed that the message source 16 takes the form of an analog speech signal source. The wave form of the speech signal (denoted by "Si"), obtained from the source 16, is schematically shown in FIG. 2A. The speech signal S1 undergoes digital signal processing at the source encoder 18. That is, the speech signal is initially digitized at a time interval of 40 ms (for example) which is called as a frame. Subsequently, the digitized speech signal is compressed and then applied to the bit selector 20 as a bit sequence S2 in a burst mode as best seen from FIG. 2B. If the bit rate of digitization is 4K bits/sec, it is readily appreciated that each frame of 10 ms contains 160 bits. It is further assumed that the first bit of the burst signal is a mode bit indicating whether the corresponding frame is a voice frame or a silence frame. This mode bit appearing at the beginning of each frame is very important and hence has to be correctly transmitted to the receiver 12. The remaining second (to the last) bits of each frame are not as important as the mode bit.

The bit selector 20 selects the above mentioned mode bit from the incoming frame data. This bit selection is carried out under control of a bit select signal applied to the selector 20 from a central processor unit (CPU) (not shown) which supervises the overall operation of the transmitter 10. The other bits which have not been selected by the bit selector 20 are directly supplied to the bit combiner 24.

The mode bit thus selected is fed to the block encoder 22 which, in this particular embodiment, outputs "01" and "10" when the applied mode bit is "0" and "1", respectively. The bit combiner 24 combines or merges the output of the block encoder 22 and the bit selector 20 in this order. A bit sequence (depicted by "A") from the bit combiner 24 is applied to the convolutional encoder 26.

In the foregoing, it is assumed that a given frame of the bit sequence S2 outputted from the source encoder 18 is represented by $$S2=(0\ 0\ 0\ 1\ldots) \qquad (1)$$

As mentioned above, if the mode bit is "0" then the output of the block encoder 22 is "01". Thus, the combiner 24 issues the output A which is given by $$A=(0\ 1\ 0\ 0\ 1\ldots) \qquad (2)$$

Figure 3:
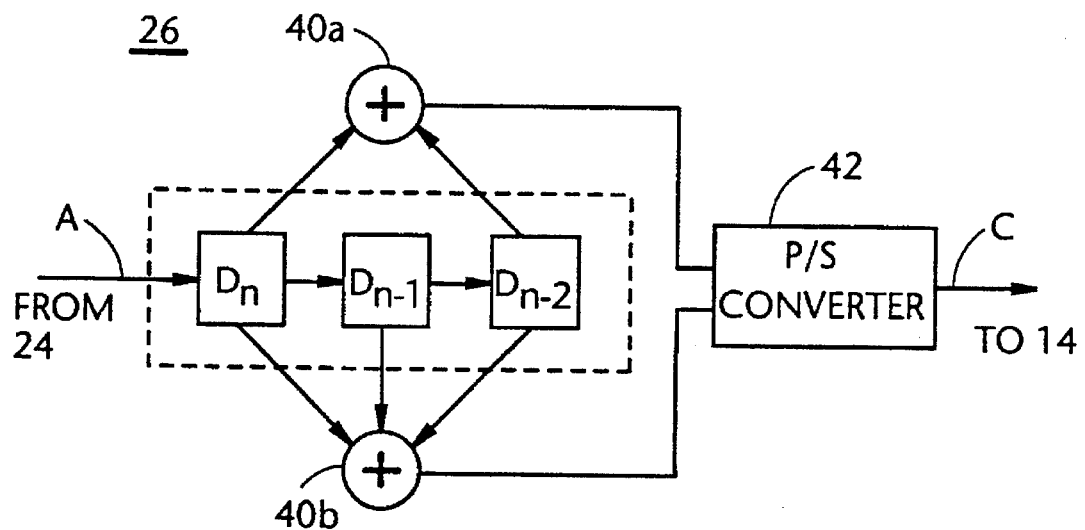
FIG. 3 is a block diagram schematically showing an arrangement of a block of FIG. 1.

Referring to FIG. 3, the arrangement of the convolutional encoder 36 is shown in block diagram form. The encoder 26 is of a conventional type and includes three delay lines or shift registers (denoted by $D_n$, $D_{n=1}$ and $D_{n=2}$), two module-2 adders 40a–40b, and a parallel/serial (P/S) converter 42, in this particular embodiment. Thus, the constraint length (K) of the encoder 26 is 3 (three) while the code rate (R) thereof is ½. The arrangement illustrated in FIG. 3 is well known in the art.

Figure 4:
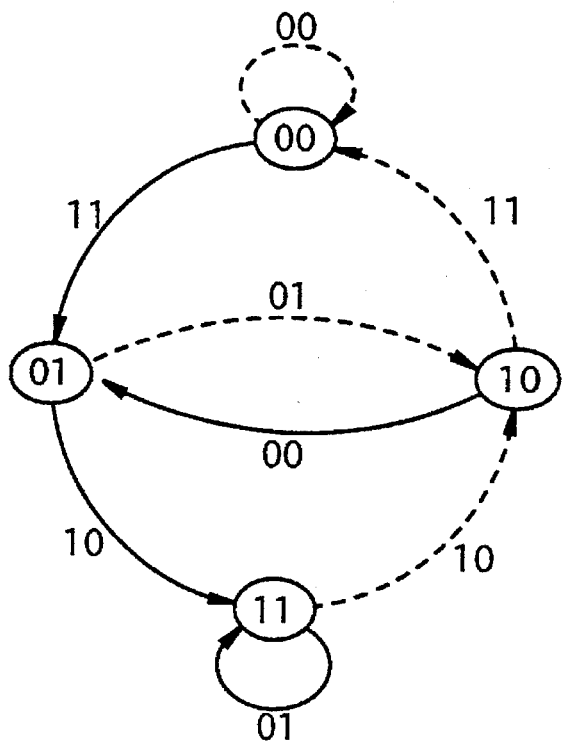
FIG. 4 is a known encoder state diagram by which the operations of the first embodiment are discussed.

FIG. 4 is a state diagram of the encoder 26. In FIG. 4, two consecutive bits within each of ovals indicates the bits held in the last two delay lines $D_{n=2}$ and $D_{n=1}$, and indicates an encoder state. The encoder states (00), (01), (10) and (11) are connected or looped by solid and broken arrow lines. If a bit "1" is applied to the encoder 26, the encoder state is shifted to the other state or returned to the same state along the solid arrow. On the other hand, if a bit "0" is applied to the encoder 26 then the encoder state is shifted to the other state or returned to the same state along the broken arrow. The outputs of the convolutional encoder 26 are represented along the corresponding arrows such as (00), (01), (10) and (11).

The encoder 26 is set to the state (00) before a burst bit sequence is newly applied. Therefore, if the mode bit (viz., first bit) is "0" and is applied to the encoder 26, the encoder state (00) remains unchanged. In this case, the output of the encoder 26 is (00). Following this, if the second bit is "1" and is applied to the encoder 26, the encoder 26 takes the state (01) and outputs two bits sequence (11). Thereafter, similar operations continue. Thus, if the bit sequence A of (0 1 0 0 0 . . . ) is applied to the convolutional encoder 26 as mentioned in expression (2), the bit sequence C obtained from the encoder 26 and then sent over the channel 14 is given by $$C=(00\ 11\ 01\ 11\ 11\ldots) \qquad (3)$$

The bit sequence C is transmitted over the channel 14 and applied to the receiver 12 as a bit sequence CC. It is assumed the bit sequence C is subjected to bit errors during transmission and that the bit sequence CC is represented by $$CC=(01\ 11\ 01\ 01\ 11\ldots) \qquad (4)$$

The operation of the maximum-likelihood decoder 28 of the receiver 12 will be discussed with reference to trellis diagrams showing in FIGS. 5–7. The above mentioned bit sequences A, C and CC, given by expressions (2)=(4) are shown at the top portions of each of FIGS. 5–7. It is well known that the trellis diagram represents the encoder states (see FIG. 4) along a time axis. It should be noted in FIGS. 5–7 that numerals above the encoder states represent respectively "decimal numbers" indicating path metrics.

Figure 5:
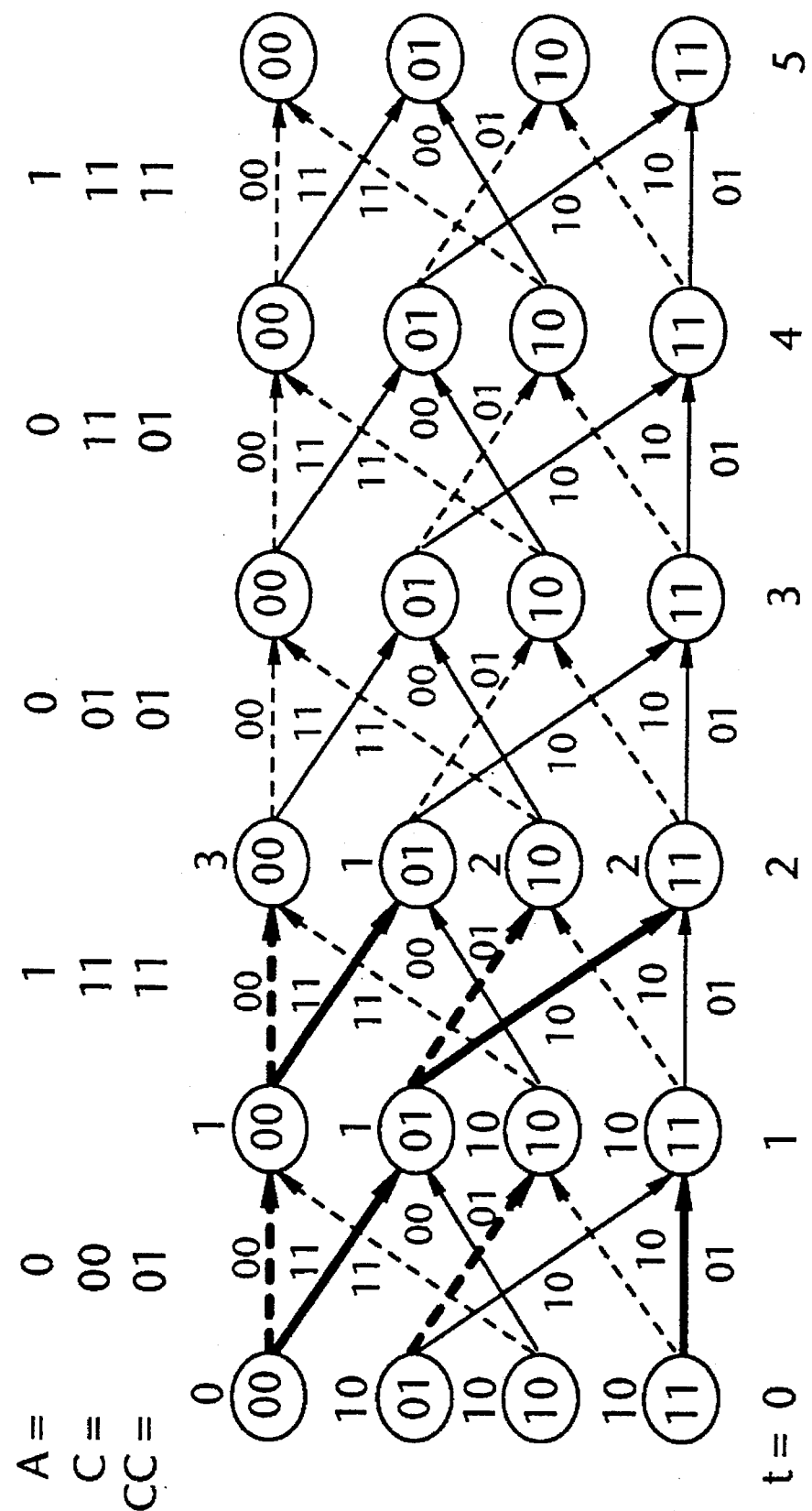
FIGS. 5–7 each is a trellis diagram by which the operations of the first embodiment are discussed.

Reference is made to FIG. 5. The decoder 28 is initialized such that the path metric of the encoder state (00) is set to 0 while each of the remaining path metrics of the other states )01), (10) and (11) is set to a sufficiently large number such as 10 (decimal) in this particular embodiment. These path metrics are illustrated at the first time point (t=0).

The decoder 28 initially decodes the first two bits (viz., encoded mode bit) using the previously known block code information (01 and 10). This information has been stored in a suitable memory in the receiver 12 and is applied to the decoder 28.

The first bit sequences have been block encoded at the encoder 22, and thus it is appreciated that survivor paths at t=1 and t=2 are represented by two bold solid lines and two bold broken lines as illustrated.

A bit sequence of the survivor path extending to the state (00) at t=2 is (00), and hence, this path is unable to be finally selected. Further, a bit sequence of the survivor path extending to the state (01) at t=2 is (11). Therefore, this path is expected to finally be selected. On the other hand, the survivor path extending to the state (10) at t-2 can be expected to be chosen for determining the decoded sequence, while the survivor path extending to the state (11) at t-2 cannot be expected to be used to determine the decoded sequence.

Figure 6:
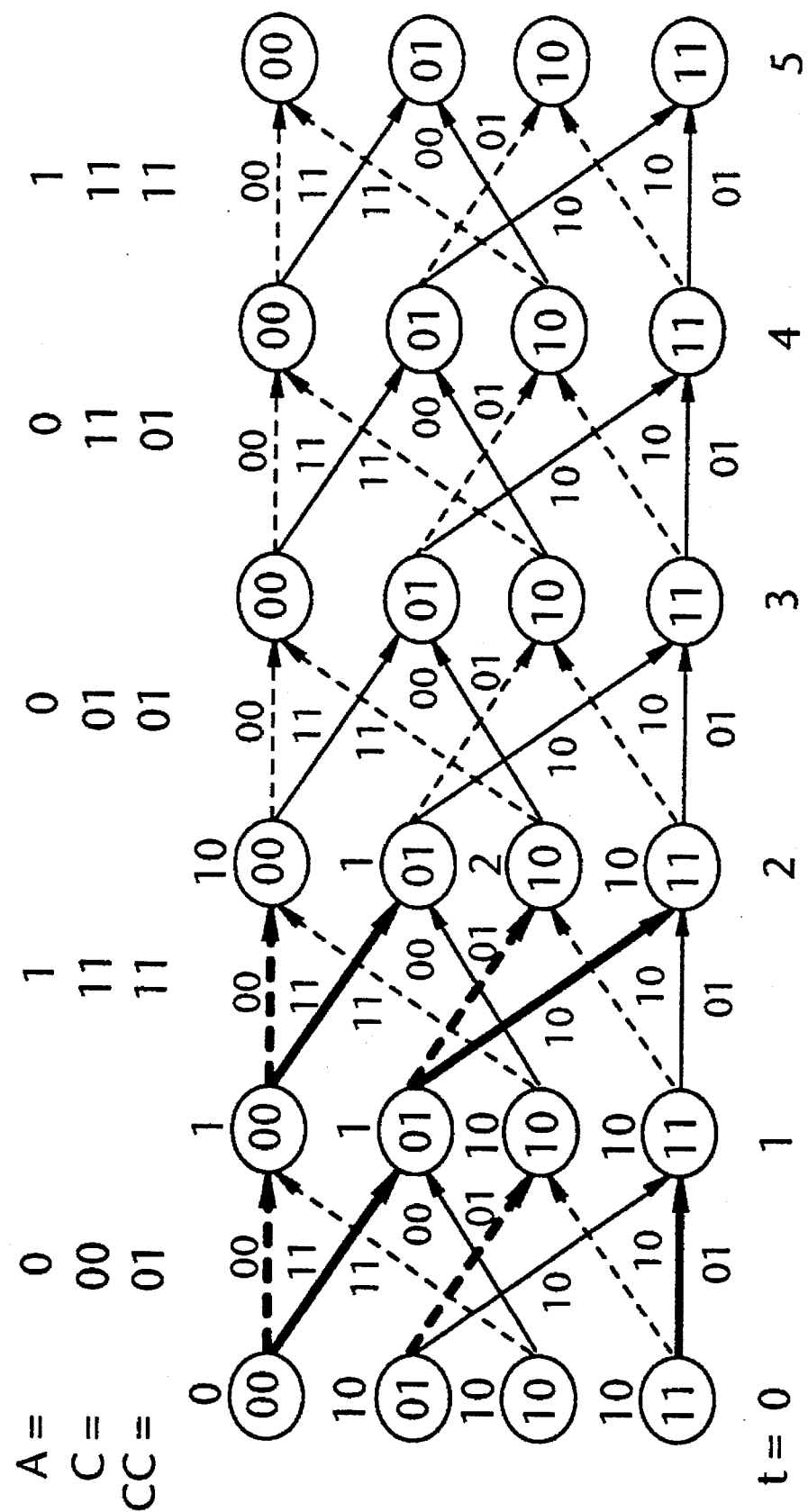
Figure 7:
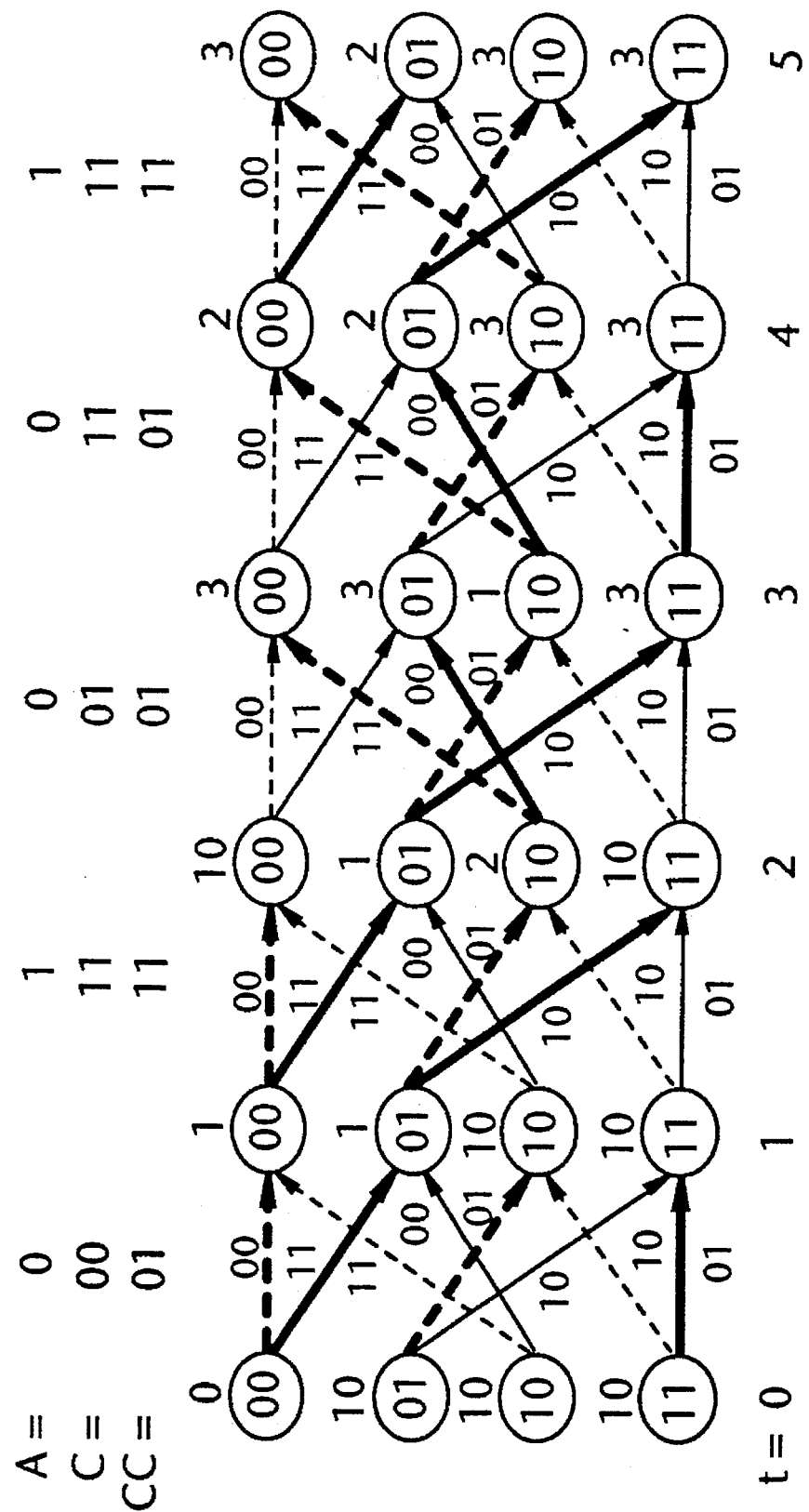

Therefore, in order to determine the following survivor paths, path metrics at the states (00) and (11) both at t=2 are set to sufficiently large number such as 10 (decimal) in this case, as shown in FIG. 6. This excludes the survivor paths which cannot eventually be used for estimating the incoming bit sequence.

Subsequently, conventional decoding according to the Viterbi algorithm is implemented which is well known in the art and thus will not be discussed for the sake of brevity. Survivor paths determined up to 5=5 are illustrated by bold solid and broken lines to FIG. 7.

The decoded bit sequence from the maximum-likelihood decoder 28, is then applied to the bit selector 30. This selector 30 implements the reverse operation of the counterpart thereof 20 in response to a bit select signal which has previously been stored in the receiver 12. The first two bits of the frame are applied to the block decoder 32 while the remaining bits are directly applied to the bit combiner 34. The bit selector 30 decodes the first two bits "0" or "1" and then applies the decoded bit to the bit combiner 34. The bit sequence aligned at the bit combiner 34 is applied to the source decoder 36 which produces an estimated message.

In the aforesaid first embodiment, the mode information is a single bit. However, it is within the scope of the present invention to set the mode information to two or more than two bits in order to meet the needs of an application. Further, the bit combiner 24 is arranged to insert the output of the block encoder 22 into a given position of the bit stream applied thereto from the bit selector 20.

Figure 8:
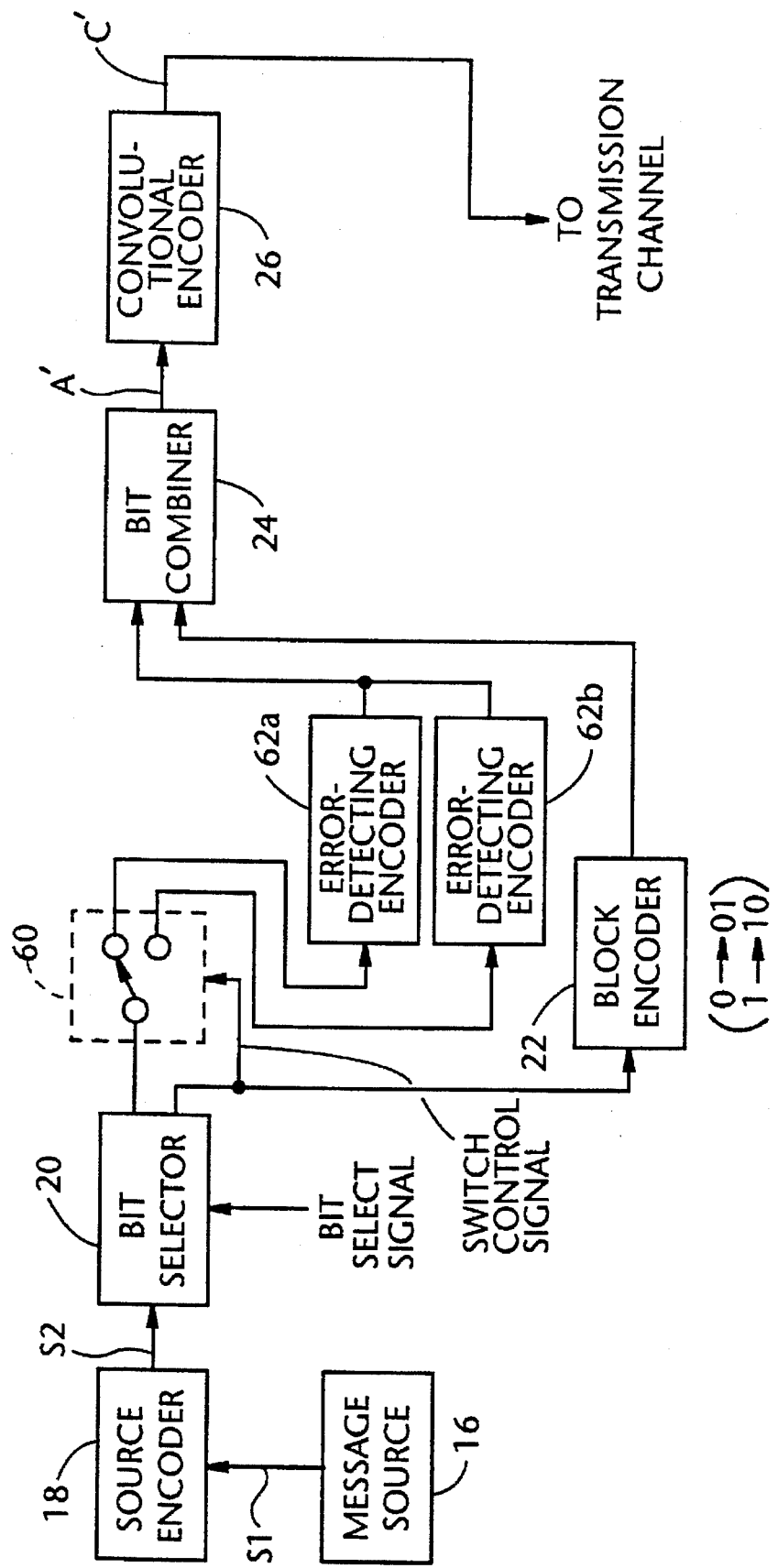
FIG. 8 is a block diagram schematically showing a transmitter of a second embodiment.
Figure 9:
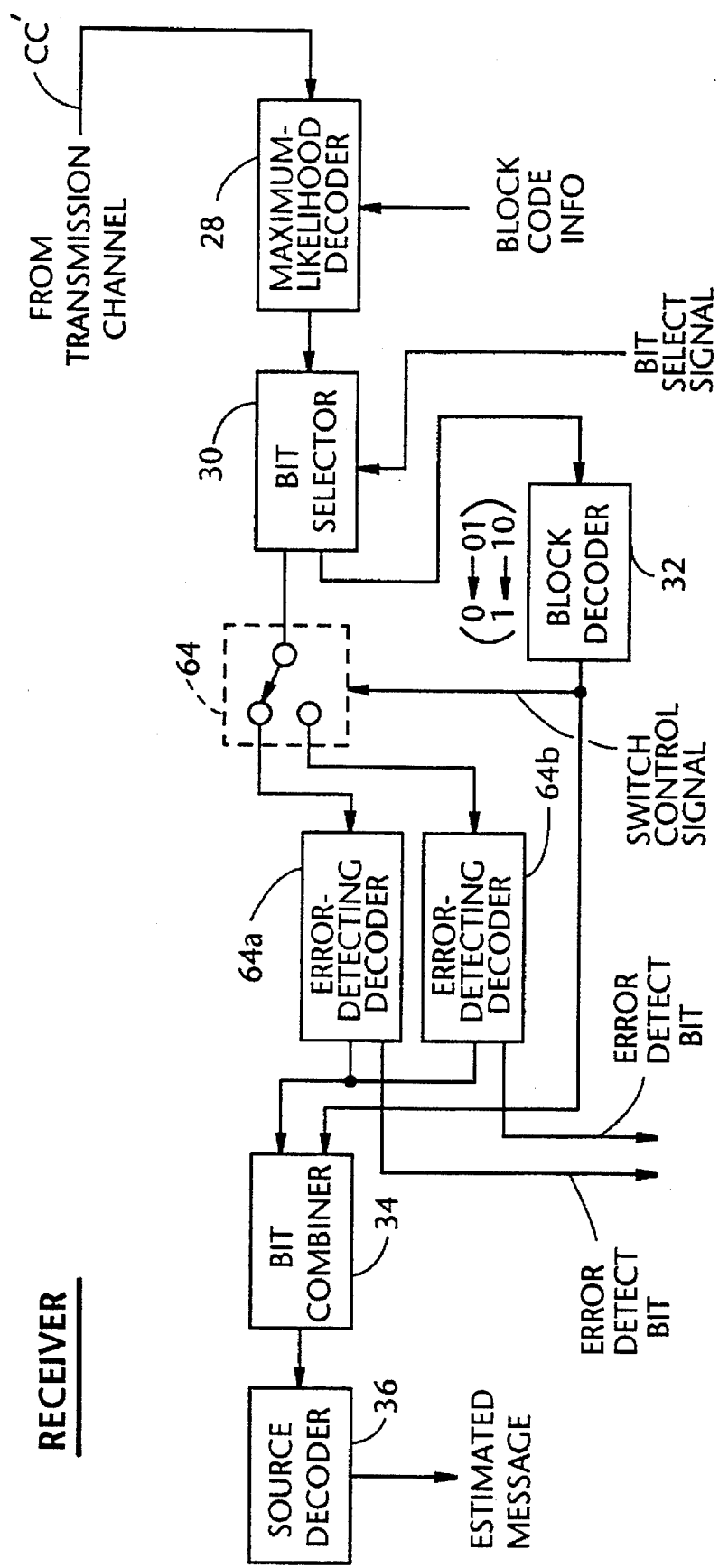
FIG. 9 is a block diagram schematically showing a receiver of the second embodiment.

Reference is made to FIGS. 8 and 9, wherein a second embodiment of the present invention is schematically shown in block diagram. The second embodiment is an error-control coding apparatus which includes both error-correcting and error-detecting functions. FIGS. 8 and 9 show respectively a transmitter and receiver of the second embodiment.

The transmitter shown in FIG. 8, when compared with the counterpart of the first embodiment further includes a switch 60 and two error-detecting encoders 62a and 62b. Accordingly, the blocks of FIG. 8 which have been referred to in the first embodiment, are described where such discussion provides context for the description of the second embodiment.

The mode bit obtained from the bit selector 20 is applied to the switch 60 as a switch control signal. The remaining bits from the bit selector 20 are applied to the switch 60. When the mode bit is a logic "0", the switch 60 allows the incoming bit sequence to be applied to the error-detecting encoder 62a. Contrarily, when the mode bit is a logic "1" then the switch 60 applies the incoming bit sequence to the other encoder 62b.

It is that an error-detecting encoder adds redundant bits to a bit sequence (viz., detection bits) applied thereto for the purpose of error detection.

In the second embodiment, the encoders 62a and 62b add the same length of redundant bits to the bit sequences applied thereto. However, the two encoders 62a and 62b produce or arrange different redundant bits from each other. This is very preferable in the case where significant bits are different depending on the logic level of the mode bit (viz., whether the frame data is voice mode or not in this particular embodiment).

The receiver shown in FIG. 9 in addition to the receiver 12 of the first embodiment, includes a switch 64 and two error-detecting decoders 64a and 64b. Accordingly, the blocks of FIG. 9 which have been referred to in the first embodiment, are described where such discussion provides context for the description of to the second embodiment.

The decoded mode bit obtained from the block decoder 32 is applied to the switch 64 as a switch control signal. The bit sequence, except for the mode bit, outputted from the bit selector 30, is applied to the switch 64. When the decoded mode bit (viz., switch control signal) is a logic "0", the switch 64 allows the incoming bit sequence to be applied to the error-detecting decoder 64a. Contrarily, when the decoded mode bit assumes a logic "1", the switch 64 applies the incoming bit sequence to the other decoder 64b.

Each of the error detecting decoders 64a and 64b outputs an error detect bit indicating whether or not the received bit sequence includes an error. Further, the decoders 64a and 64b apply the decoded bit sequences to the bit combiner 34. The subsequent operations are essentially the same as those mentioned in connection with the first embodiment.

Another feature of the second embodiment is that if the mode bit is erroneously transmitted, each of the decoders 64a and 64b issues the error detect bit which indicates the presence of transmission error. This is very advantageous in that, as mentioned above, correct transmission of the mode bit is important.

Figure 10:
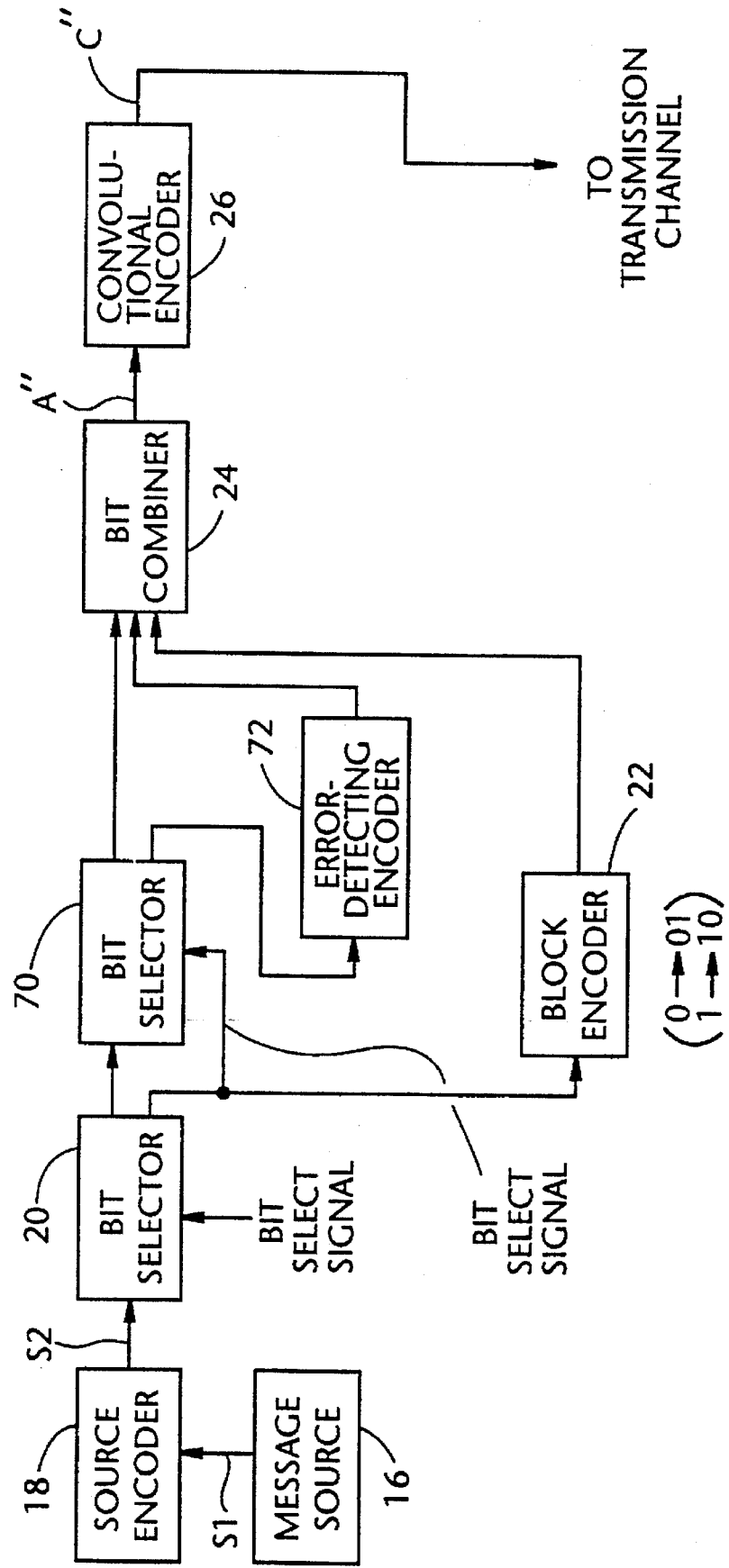
FIG. 10 is a block diagram schematically showing a transmitter of a third embodiment.
Figure 11:
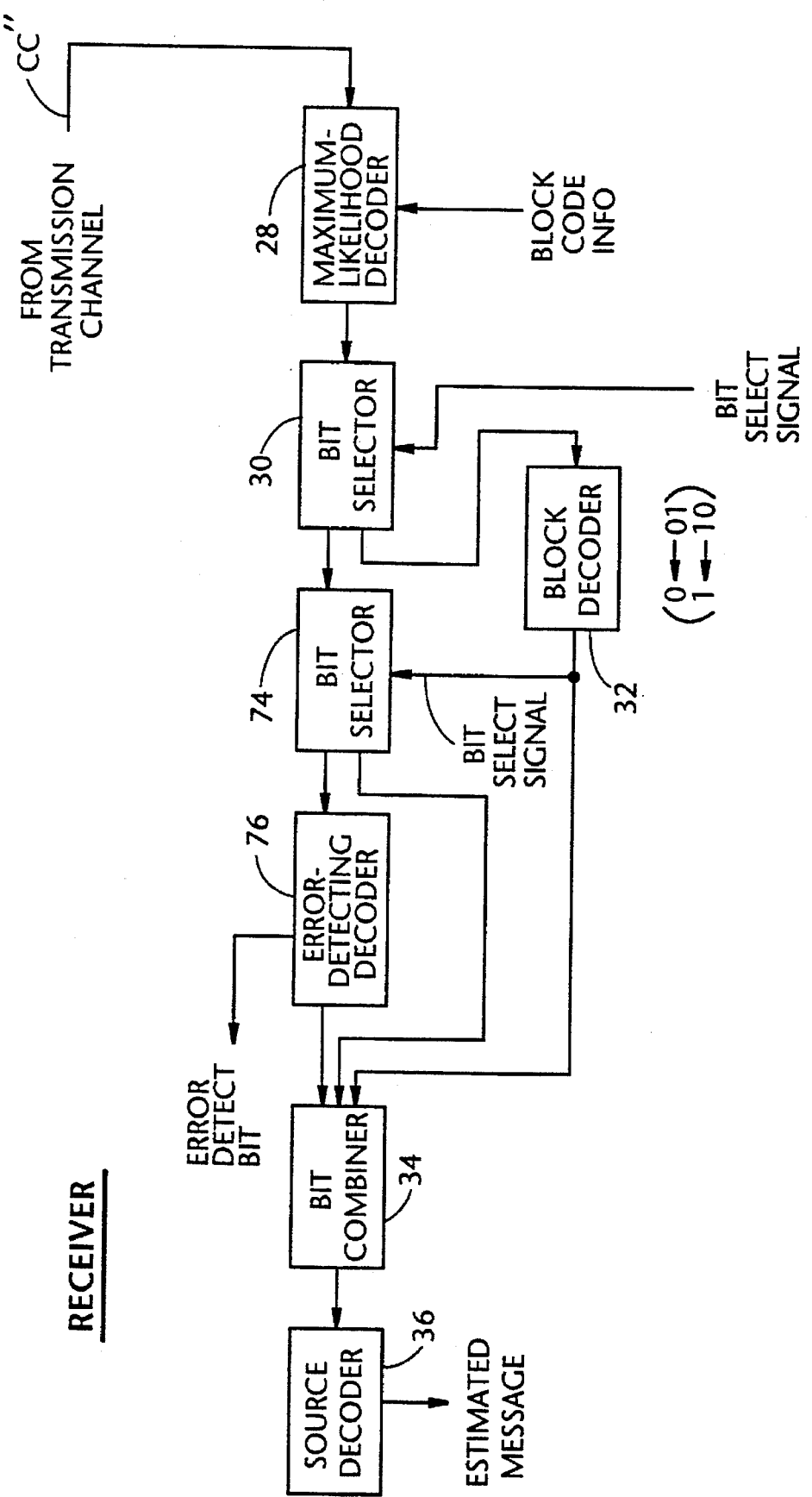
FIG. 11 is a block diagram schematically showing a receiver of the third embodiment.

Reference is made to FIGS. 10 and 11, wherein a third embodiment of the present invention is schematically shown in block diagram. The third embodiment is an error-control coding apparatus which includes both error-correcting and error-detecting functions. FIGS. 10 and 11 show respectively a transmitter and receiver of the third embodiment.

The transmitter shown in FIG. 10 as compared with the counterpart 10 of the first embodiment further includes a bit selector 70 and an error-detecting encoder 72. Accordingly, the blocks of FIG. 10 which have been referred to in the first embodiment, are described, where such discussion provides context for the description of the third embodiment.

The mode bit obtained from the bit selector 20 is applied to the bit selector 70 as a bit select signal. The remaining bits of a frame, outputted from the bit selector 20, are applied to the bit selector 70. The mode bit applied to the bit selector 70 determines which portion of the bit sequence applied thereto should be transferred to the error-detecting encoder 72. The number of consecutive bits selected for one logic level of the mode bit is usually different from that selected in response to the other logic level of the mode bit. This is very advantageous in the case where significant bits are different in position depending on the logic levels of the mode bit (viz., whether the frame data is a voice mode or not in this particular embodiment). The bit combiner 24 combines the outputs of the blocks 22, 70 and 72.

FIG. 11 shows a receiver of the third embodiment. The operations of this embodiment is readily appreciated from the foregoing and thus, the descriptions thereof is omitted for brevity.

It will be understood that the above disclosure is representative of only three possible embodiments and that various modifications can be made without departing from the concept of the invention.

What is claimed is:

1. An apparatus for error-control coding, comprising:

a selector for selecting at least one bit from a bit sequence applied thereto, said at least one bit being selected to be transmitted with a higher reliability than remaining bits of said bit sequence;

a first encoder for block encoding said at least one bit applied thereto from said selector, thereby forming a valid error-control sequence, said valid error-control sequence adapted to become an invalid error-control sequence due to later transmission errors;

a combiner for combining the output of said first encoder and a bit sequence which has not been selected at said selector;

a second encoder for implementing convolutional encoding to the bit sequence outputted from said combiner;

a first decoder for implementing maximum-likelihood decoding to the bit sequence transmitted; and a second decoder for block decoding the block encoded bit data.

2. An apparatus for error-control coding, which includes a data transmitter and a data receiver interconnected via a transmission channel, said data transmitter including:

a first bit selector for selecting at least one predetermined bit from a bit sequence applied thereto, said at least one predetermined bit being selected to be transmitted with a higher reliability than remaining bits of said bit sequence, said first bit selector outputting said at least one predetermined bit and a first bit sequence which does not include said least one predetermined bit;

a first encoder, coupled to said first bit selector, for error-control coding said at least one predetermined bit to form a second bit sequence comprising a valid error-control sequence, said valid error-control sequence adapted to become an invalid error-control sequence due to later transmission errors, and outputting said second bit sequence;

a first bit combiner, coupled to said first bit selector and said first encoder, for combining said first and second bit sequences, said first bit combiner outputting a combined bit sequence; and a second encoder for convolutionally encoding said combined bit sequence into a third bit sequence which is transmitted to said data receiver via said transmission channel.

3. An apparatus as claimed in claim 2, wherein said data receiver comprises:
  a first decoder for decoding said third bit sequence, applied thereto over said transmission channel, using a Viterbi algorithm;
  a second bit selector, coupled to said first decoder, for selecting a fourth bit sequence from an output of said first decoder, said fourth bit sequence corresponding to said second bit sequence, said second bit selector outputting said fourth bit sequence and a fifth bit sequence which does not include said fourth bit sequence;
  a second decoder coupled to decode said fourth bit sequence, said second decoder outputting at least one bit which corresponds to said at least one predetermined bit; and
  a second bit combiner, coupled to said second bit selector and said second decoder, combining said at least one bit and said fifth bit sequence.

4. An apparatus for error-control coding, which includes a data transmitter and a data receiver interconnected via a transmission channel, said data transmitter including:
  a first bit selector for selecting at least one predetermined bit from a bit sequence applied thereto, said first bit selector outputting said at least one predetermined bit and a first bit sequence which does not include said at least one predetermined bit;
  a first encoder, coupled to said first bit selector, for encoding said at least one predetermined bit and outputting a second bit sequence which corresponds to the at least one predetermined bit which has been encoded at said first encoder;
  first and second error detecting encoders which are provided in parallel with each other;
  a first switching means coupled to receive said first bit sequence and said at least one predetermined bit, said switching means selectively applying said first bit sequence to one of said first and second error detecting encoders depending on said at least one predetermined bit;
  a first bit combiner coupled to combine said second bit sequence and one of outputs of said first and second error detecting encoders, said first bit combiner outputting a combined bit sequence; and
  a second encoder for convolutionally encoding said combined bit sequence into a third bit sequence which is transmitted to said data receiver via said transmission channel.

5. An apparatus as claimed in claim 4, wherein said data receiver comprises:
  a first decoder for decoding said third bit sequence, applied thereto over said transmission channel, using a Viterbi algorithm;
  a second bit selector, coupled to said first decoder, for selecting a fourth bit sequence from an output of said first decoder, said fourth bit sequence corresponding to said second bit sequence, said second bit selector outputting said fourth bit sequence and a fifth bit sequence which does not include said fourth bit sequence;
  a second decoder coupled to decode said fourth bit sequence, said second decoder outputting at least one bit which corresponds to said at least one predetermined bit;
  first and second error detecting decoders which are provided in parallel each other;
  a second switching means coupled to receive said fifth bit sequence and said at least one bit, said second switching means selectively applying said fifth bit sequence to one of said first and second error detecting decoders depending on said at least one bit; and
  a second bit combiner coupled to combine said at least one bit and an output of one of said first and second error detecting decoders.

6. An apparatus for error-control coding, which includes a data transmitter and a data receiver interconnected via a transmission channel, said data transmitter including:
  a first bit selector for selecting at least one predetermined bit from a bit sequence applied thereto, said first bit selector outputting said at least one predetermined bit and a first bit sequence which does not include said at least one predetermined bit;
  a first encoder, coupled to said first bit selector, for encoding said at least one predetermined bit and outputting a second bit sequence which corresponds to the at least one predetermined bit which has been encoded at said first encoder;
  a second bit selector coupled to receive said first bit sequence and said at least one predetermined bit, said second bit selector selecting a third bit sequence of a predetermined length from said first bit sequence depending on said at least one predetermined bit, said second bit selector outputting a fourth bit sequence which does not include said third bit sequence;
  an error detecting encoder which receives said third bit sequence and adds redundant bits thereto, said error detecting encoder outputting a fifth bit sequence which includes said third bit sequence and said redundant bits;
  a first bit combiner, coupled to combine said second, fourth and fifth bit sequences, said first bit combiner outputting a combined bit sequence; and
  a second encoder for convolutionally encoding said combined bit sequence into a sixth bit sequence which is transmitted to said data receiver via said transmission channel.

7. An apparatus as claimed in claim 6, wherein said data receiver comprises:
  a first decoder for decoding said sixth bit sequence, applied thereto over said transmission channel, using a Viterbi algorithm;
  a third bit selector, coupled to said first decoder, for selecting a seventh bit sequence from an output of said first decoder, said seventh bit sequence corresponding to said second bit sequence, said third bit selector outputting said seventh bit sequence and an eighth bit sequence which does not include said seventh bit sequence;
  a second decoder coupled to decode said seventh bit sequence, said second decoder outputting at least one bit which corresponds to said at least one predetermined bit; and
  a third bit selector coupled to receive said eighth bit sequence from said third bit selector and receive said at least one bit from said second decoder, said third bit selector selecting ninth and tenth bit sequences which respectively correspond to said fourth and fifth bit sequences;
  an error detecting encoder arranged to decode said tenth bit sequence; and
  a second bit combiner coupled to combine said at least one bit from said second decoder, said ninth bit sequence and an output of said error detecting encoder.

8. A method for error-control coding comprising the steps of:

selecting at least one bit from an initial bit sequence;

encoding said at least one bit thereby forming an encoded bit;

combining said encoded bit with bits in said initial bit sequence which are not selected thereby forming a second bit sequence;

convolutionally encoding said second bit sequence thereby forming a third bit sequence;

decoding said third bit sequence using maximum-likelihood decoding to form a fourth bit sequence; and decoding said fourth bit sequence.

9. A method as claimed in claim 8 wherein said step of selecting selects a mode bit from said initial bit sequence.

10. A method as claimed in claim 8 wherein said step of encoding encodes a logic "0" as "01" and encodes a logic "1" as "10".

11. An apparatus for error-control coding, comprising:

a bit selector for selecting at least one bit from an initial bit sequence;

a block encoder for encoding said at least one bit selected by said bit selector, thereby forming an encoded bit;

first and second error-detecting encoders for adding redundant bits to bits in said initial bit sequence which are not selected by said bit selector, thereby forming a first and second encoded bit sequence, respectively;

a switch for switching the bits in said initial bit sequence which are not selected by said bit selector to at least one of said first and second error-detecting encoders;

a bit combiner for combining said encoded bit with said first second encoded bit sequences thereby forming a combined bit sequence;

a convolutional encoder for convolutionally encoding said combined bit sequence thereby forming a combined-encoded bit sequence;

a maximum-likelihood decoder for decoding said combined-encoded bit sequence using maximum-likelihood decoding to form a maximum-likelihood bit sequence; and a block decoder for decoding said maximum-likelihood bit sequence.

12. An apparatus as claimed in claim 11, wherein said switch is switched in response to a logic value of said encoded bit.

13. An apparatus as claimed in claim 11, wherein said switch switches the bits in said initial bit sequence which are not selected by said bit selector to only one of said first and second error-detecting encoders.

14. An apparatus as claimed in claim 11, wherein said first and second error-detecting encoders encode similar initial bit sequences into differing encoded bit sequences.

15. An apparatus as claimed in claim 11, wherein said first and second error-detecting encoders encode similar initial bit sequences into encoded bit sequences of different lengths.

* * * * *